(12) United States Patent
Lee et al.

(10) Patent No.: US 8,058,781 B2
(45) Date of Patent: Nov. 15, 2011

(54) ANODIZED METAL SUBSTRATE MODULE

(75) Inventors: Young Ki Lee, Seoul (KR); Seog Moon Choi, Seoul (KR); Young Bok Yoon, Gyunggi-Do (KR); Sang Hyun Shin, Gyunggi-Do (KR)

(73) Assignees: Samsung Electro-Mechanics Co., Ltd., Gyunggi-Do (KR); Samsung LED Co., Ltd., Gyunggi-Do (KR)

( * ) Notice: Subject to any disclaimer, the term of this patent is extended or adjusted under 35 U.S.C. 154(b) by 213 days.

(21) Appl. No.: 11/723,059

(22) Filed: Mar. 16, 2007

(65) Prior Publication Data
US 2007/0217221 A1 Sep. 20, 2007

(30) Foreign Application Priority Data
Mar. 17, 2006 (KR) .................. 10-2006-0025010

(51) Int. Cl.
H01K 1/02 (2006.01)
F21V 7/04 (2006.01)
(52) U.S. Cl. .......................... 313/46; 362/612
(58) Field of Classification Search .............. 362/612
See application file for complete search history.

(56) References Cited

U.S. PATENT DOCUMENTS

| 7,268,014 | B2* | 9/2007 | Lee et al. ..................... | 438/106 |
| 7,497,596 | B2* | 3/2009 | Ge ................................. | 362/294 |
| 2001/0030866 | A1* | 10/2001 | Hochstein ..................... | 362/294 |
| 2002/0001177 | A1 | 1/2002 | Petitbon | |
| 2005/0068776 | A1 | 3/2005 | Ge | |
| 2005/0116235 | A1* | 6/2005 | Schultz et al. ................ | 257/79 |
| 2005/0122018 | A1* | 6/2005 | Morris ............................ | 313/46 |
| 2007/0080360 | A1* | 4/2007 | Mirsky et al. ................. | 257/99 |

FOREIGN PATENT DOCUMENTS

| CN | 1608326 A | 4/2005 |
| JP | 63-107483 | 5/1988 |
| JP | 2000-353826 | 12/2000 |
| JP | 2003-57461 | 2/2003 |
| JP | 2004-241416 | 8/2004 |

OTHER PUBLICATIONS

Korean Office Action, with English translation, issued in Korean Patent Application No. 10-2006-0025010, mailed Apr. 25, 2007.
Chinese Office Action, w/ English translation thereof, issued in Chinese Patent Application No. CN2007100875234 dated May 8, 2009.
Japanese Office Action issued in Japanese Patent Application No. JP 2007-067887, dated Jul. 28, 2009.
Chinese Office Action, w/ English translation thereof, issued in Chinese Patent Application No. CN 200710087523.4 dated Dec. 4, 2009.
Japanese Office Action, w/ English translation thereof, issued in Japanese Patent Application No. JP 2007-067887 mailed Mar. 30, 2010.

(Continued)

Primary Examiner — Toan Ton
Assistant Examiner — Britt Hanley
(74) Attorney, Agent, or Firm — McDermott Will & Emery LLP

(57) ABSTRACT

An anodized metal substrate module superior in heat radiation properties and reduced in manufacturing costs. A metal plate is provided. An anodized film is formed on the metal plate. A heat generating device is mounted on the metal plate. Also, a conductive line is formed on the anodized film.

10 Claims, 11 Drawing Sheets

OTHER PUBLICATIONS

Japanese Decision to Decline Amendment, with English translation, issued in Japanese Patent Application No. 2007-067887, dated Jan. 4, 2011.

Japanese Decision of Rejection, with English translation, issued in Japanese Patent Application No. 2007-067887, dated Jan. 4, 2011.

* cited by examiner (a)

(b)

ANODIZED METAL SUBSTRATE MODULE

CLAIM OF PRIORITY

This application claims the benefit of Korean Patent Application No. 2006-25010 filed on Mar. 17, 2006 in the Korean Intellectual Property Office, the disclosure of which is incorporated herein by reference.

BACKGROUND OF THE INVENTION

1. Field of the Invention

The present invention relates to a substrate module mounted with a heat generating device such as a light emitting diode and a power chip, and more particularly, to an anodized metal substrate module superior in heat radiation properties, which can be applied to a backlight unit and a surface light source device.

2. Description of the Related Art

Recently, researches have been under way to improve heat radiation properties of a circuit board. Conventionally, a heat generating device has been mounted on a printed circuit board (PCB) having an insulating base substrate. However, a typical PCB, if mounted with a device such as a light emitting diode or a power chip which generates a considerable amount of heat, is degraded in reliability due to poor heat transfer properties thereof. The typical PCB with inferior heat radiation properties proves disadvantageous for a backlight unit of a liquid crystal display (LCD) or a surface light source device.

FIG. 1 is a schematic cross-sectional view illustrating a conventional printed circuit board (PCB). Referring to FIG. 1, the PCB 10 includes an insulating base substrate 11 made of resin or plastic and upper and lower conductive lines 14 formed on and underneath the base substrate 11, respectively. The upper and lower conductive lines 14 can be electrically connected with each other by, for example, a conductive via. In addition to this function of electrical connection, the via 15 may serve as a heat transfer path. Components (e.g., an LED or power chip) are mounted on the base substrate 11 to be connected to the conductive lines 14.

This conventional PCB 10 is relatively inexpensive due to low-cost materials and easy processability. But the PCB 10 is poor in heat radiation properties due to its high heat resistance. In an effort to overcome this problem, a metal core PCB (MCPCB) adopting a metal member with superb heat transfer properties has been proposed. FIG. 2 is a schematic cross-sectional view illustrating the MCPCB. Referring to FIG. 2, the MCPCB 20 includes a metal core substrate 21 made of Al and a polymer insulating layer 23 formed thereon. Conductive lines 25 are formed on the polymer insulating layer 23 and necessary devices 27 and 28 are mounted on the polymer insulating layer 23. This MCPCB 20 exhibits superior heat radiation properties to the conventional PCB (see FIG. 1). Yet the MCPCB 20 adopts the high-cost polymer insulating layer 23 with relatively high thermal conductivity, thereby considerably increasing manufacturing costs thereof.

SUMMARY OF THE INVENTION

The present invention has been made to solve the foregoing problems of the prior art and therefore an aspect of the present invention is to provide an anodized metal substrate module superior in heat radiation properties which can be manufactured at low costs and applied to a surface light source device or a back light unit having a light emitting diode therein.

According to an aspect of the invention, the anodized metal substrate module includes a metal plate; an anodized film formed on the metal plate; a heat generating device such as an LED or a power chip mounted on the metal plate; and a conductive line formed on the anodized film.

The metal plate may be made of Al or an Al alloy which is easily available at relatively low costs. Alternatively, the metal plate may be made of an anodisable material such as titanium and magnesium.

According to an embodiment of the invention, the heat generating device includes at least one light emitting diode. For example, the anodized metal substrate module may have a plurality of light sources such as the LED mounted on the metal plate, thereby used as a surface light source device or a backlight unit. The heat generating device may include a power device such as a power chip.

According to an embodiment of the invention, the anodized film is formed on the metal plate to selectively expose a portion of a top surface of the metal plate. Here, to radiate heat from the heat garneting device more effectively, the heat generating device is mounted on the exposed portion of the top surface of the metal plate.

The anodized metal substrate module may further include a metal layer formed on the exposed portion of the top surface of the metal plate. The metal layer may be a plated layer for soldering when the heat generating device is mounted. Alternatively, the metal layer may be a metal paste for mounting the heat generating device. The anodized metal substrate module may further include an insulating layer interposed between the metal layer and the metal plate. The insulating layer serves to insulate the device mounted on the metal layer from the metal plate.

According to another embodiment of the invention, the anodized film is formed on the metal plate to selectively expose a portion of a top surface of the metal plate, and at least one recess is formed in the exposed portion of the top surface of the metal plate, the recess defining a reflective cup. A light emitting diode may be disposed on a bottom surface of the reflective cup.

Accordingly, the substrate module is significantly improved in heat radiation properties and thus can impart high light efficiency to a surface light source device or an LED-based back light unit having high light efficiency.

According to another embodiment of the invention, the anodized metal substrate module further includes a heat sink integrally formed underneath the metal plate to allow air contact in a larger area. For example, the heat sink includes cooling fins extending perpendicularly from an underside surface of the metal plate.

The substrate module of the invention is noticeably improved over the conventional one in terms of heat radiation properties and manufacturing costs. The substrate module can have a plurality of LEDs (e.g., a plurality of blue, green and red LEDs) mounted thereon to be applied to a high quality surface light source or a backlight unit. Alternatively, the substrate module of the invention can be utilized as a circuit board module for mounting a device such as a power chip which generates a considerable amount of heat.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
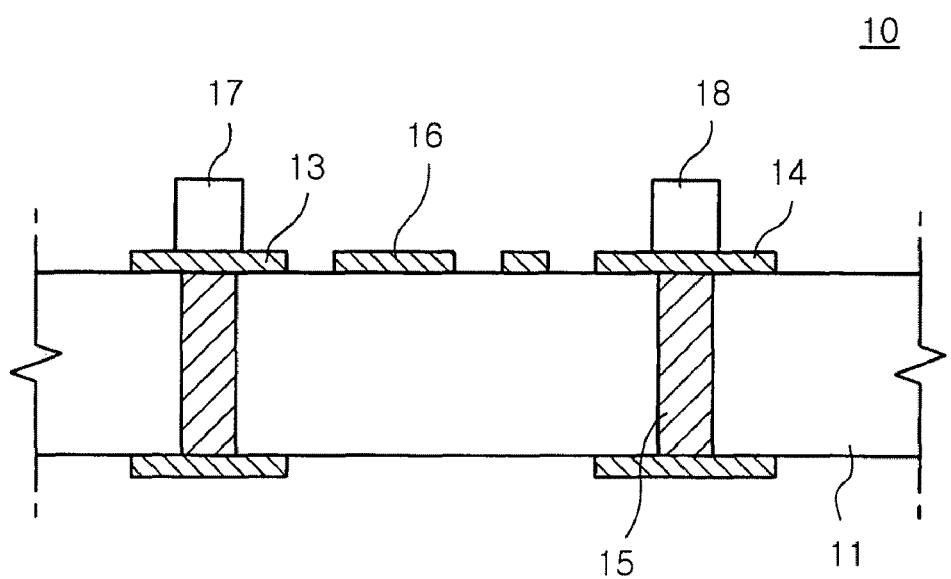
FIG. 1 is a schematic cross-sectional view illustrating a conventional printed circuit board (PCB)

Exemplary embodiments of the present invention will now be described in detail with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

Figure 3:
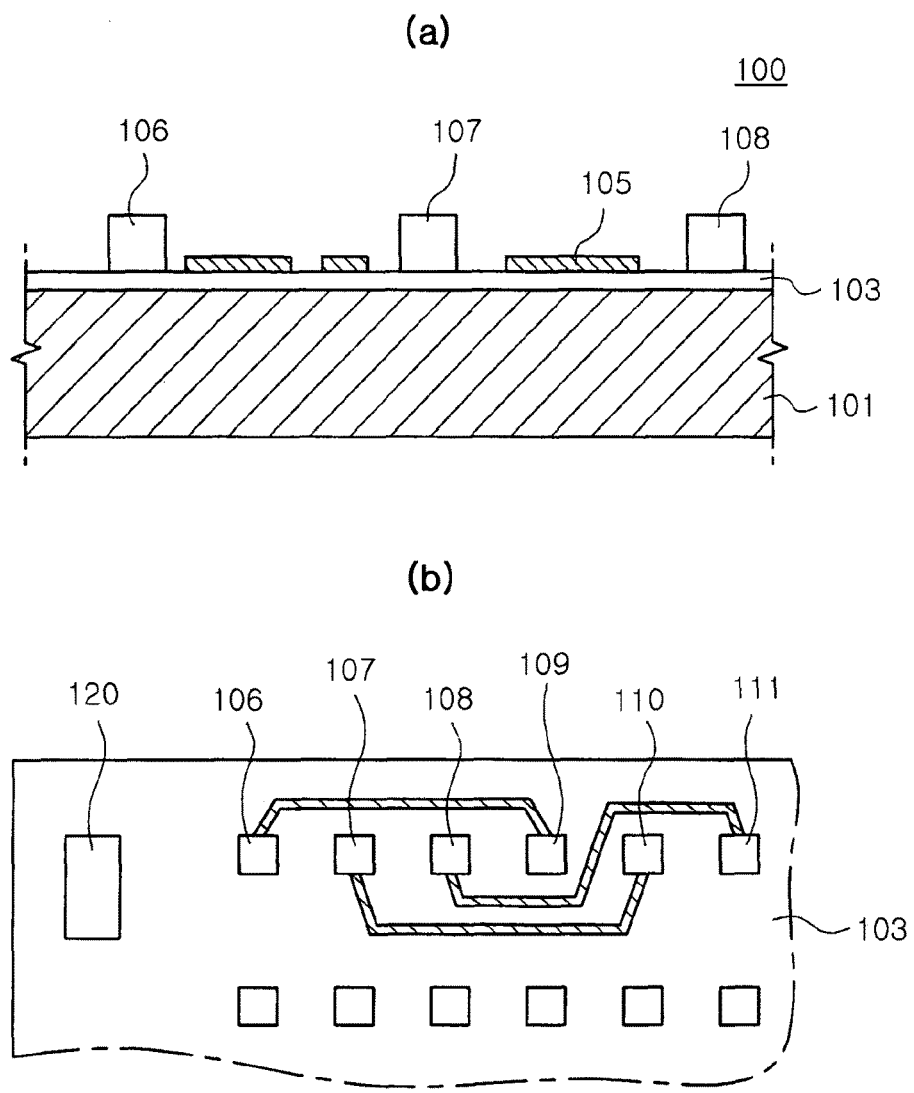
FIG. 3 is a schematic view illustrating an anodized substrate module according to an embodiment of the invention.

FIG. 3 is a schematic view illustrating an anodized metal substrate according to an embodiment of the invention, in which FIG. 3(a) is a cross-sectional view and FIG. 3(b) is a plan view. Referring to FIG. 3, the anodized metal substrate 100 includes a metal plate 101 made of Al or an Al alloy and an Al anodized film 103 formed on the metal plate 101. A plurality of heat generating devices 106 to 111 such as a light emitting diode and a power chip are mounted on the metal plate 101. Conductive lines 105 are formed on the anodized film 103 to electrically connect the devices 106 to 111 one another. Therefore, the anodized film 103 serves to insulate the conductive lines 105 from the metal plate 101. Other parts such as a connector 120 may be disposed on a portion of the anodized oxide film 103 to be electrically connected to the conductive lines. The conductive lines 105 can be formed by applying a conductive paste, depositing metal or performing inkjet printing.

Al is a metal material which is easily available at relatively low costs and very excellent in heat transfer properties. Moreover, the Al anodized film $Al_2O_3$ which is obtained by anodizing Al has a relatively high heat transfer coefficient of 10 to 30 W/mK. Therefore, the anodized metal substrate 100 exhibits better heat radiation properties than a conventional polymer substrate such as PCB or MCPCB. Furthermore, anodizing Al is a well-known easy process, which is cheap in costs and short in process time. As a result, the substrate module of the invention can be manufactured through a remarkably simple process.

In this embodiment, the base substrate, i.e., the metal plate 102 is made of Al or an Al alloy and the anodized film 103 is made of $Al_2O_3$. But the invention is not limited thereto. The metal plate may be made of other anodisable metal, for example, titanium or magnesium. But preferably, the metal plate is mainly composed of Al which is inexpensive and stable.

The anodized metal substrate module 100 is suitably applicable to a backlight unit of an LCD display or a surface light source device. That is, the heat generating devices 106 to 111 mounted are configured as a plurality of LEDs, thereby achieving a high quality surface light source device excellent in heat radiation properties. For example, a plurality of red, green and blue light emitting LEDs are disposed in the anodized metal substrate module 100. This allows the anodized substrate module 100 to be used as a white light emitting surface light source for a back light. One of the problems with the LED substrate as a surface light source device concerns how to effectively radiate a significant amount of heat generated from the LED to the outside. In this respect, the anodized metal substrate module of the invention is greatly useful as the surface light source or the backlight unit.

The anodized metal substrate module 100 can serve its usefulness not only as the surface light source but also as the general circuit substrate module. For example, the anodized metal substrate module 100 can be employed as a circuit board suitable for mounting a device such as a power chip or other integrated circuit device which generates a great amount of heat.

Figure 4:
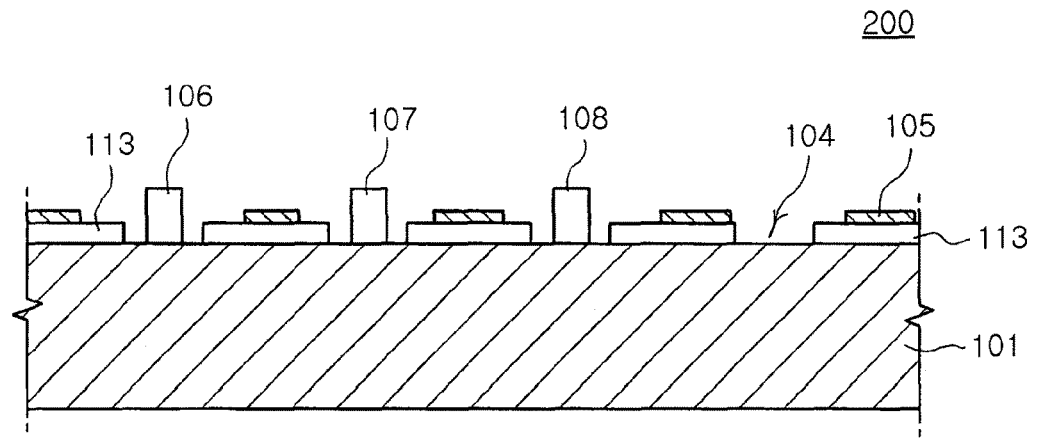
FIG. 4 is a schematic view illustrating an anodized metal substrate module according to another embodiment of the invention.
Figure 4:
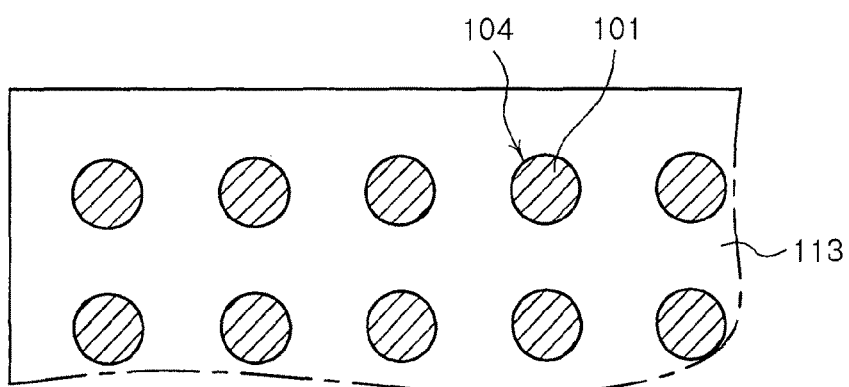

FIG. 4 is a schematic view illustrating an anodized metal substrate module 200 according to another embodiment of the invention, in which FIG. 4(a) is a cross-sectional view and FIG. 4(b) is a schematic plan view. In this embodiment, an anodized film is formed on selective portions of a metal plate 101 to radiate heat from a heat generating device more effectively. Here, the metal plate 101 directly serves as a path for transferring heat.

Referring to FIG. 4, the anodized film 113 is formed on the metal plate 101 to selectively expose portions of a top surface of the metal plate 101. A plurality of heat generating devices 106 to 108 are mounted on the exposed portions 104 of the top surface of the metal plate 101. The metal plate 101 is much higher in thermal conductivity (hundreds of W/mK) than the anodized film 113. Thus, heat generated from the devices directly mounted on the exposed portions 104 can be radiated to the outside more effectively. For convenience's sake, conductive lines 105 and the devices 106 to 108 are not illustrated in the plan view of the FIG. 4(b).

To selectively form the anodized film 113 on the metal plate 101, the entire top surface of the metal plate is anodized to form an anodized film and then selective portions of the anodized film are removed. That is, the anodization of the entire top surface of the metal plate and the removal of the selective portions of the anodized film (or etching) are performed sequentially to form the selectively anodized film 113 on the metal plate 101.

Alternatively, the selectively anodized film 113 can be formed directly by employing a proper mask pattern during anodization. For example, the mask pattern such as a resist pattern or an oxide film pattern is formed on the top surface of the metal plate 101 and then the metal plate 101 is anodized. This allows the selective portions of the top surface of the metal plate 101 to be anodized, thereby forming the anodized film 113 which selectively exposes other portions of the top surface of the metal plate 101.

Figure 5:
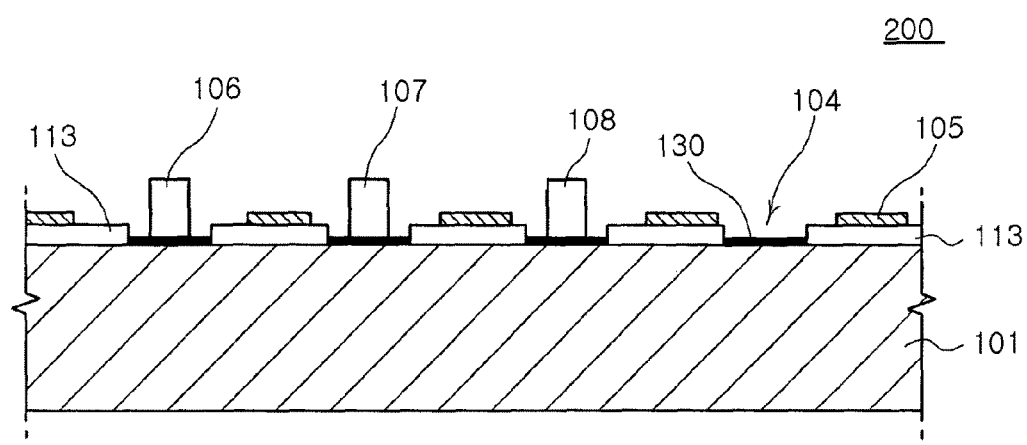
FIG. 5 is a view illustrating an anodized metal substrate module according to a modified embodiment of the invention.

FIG. 5 illustrates the anodized metal substrate module of FIG. 4 according to a modified example of the invention. Referring to FIG. 5, the anodized metal substrate module 200' includes an anodized oxide film 113 which is formed on portions of a metal plate as in the same manner as the module of FIG. 4. In this embodiment, a metal layer 130 is additionally formed on exposed portions 104 of a top surface of the metal plate 101. Heat generating devices 106 to 108 such as an LED and a power chip are mounted on the metal layer 130.

The metal layer 130 may be a plating layer for soldering when the heat generating devices 106 to 108 are mounted. Alternatively, the metal layer 130 may be a metal paste for mounting the heat generating devices 106 to 108. For example, a metal paste is formed on the exposed portions 104 and then cured after the LED or the power chip is disposed on the exposed portions 104. This markedly shortens a manufacturing time of the substrate module excellent in heat radiation properties.

Figure 6:
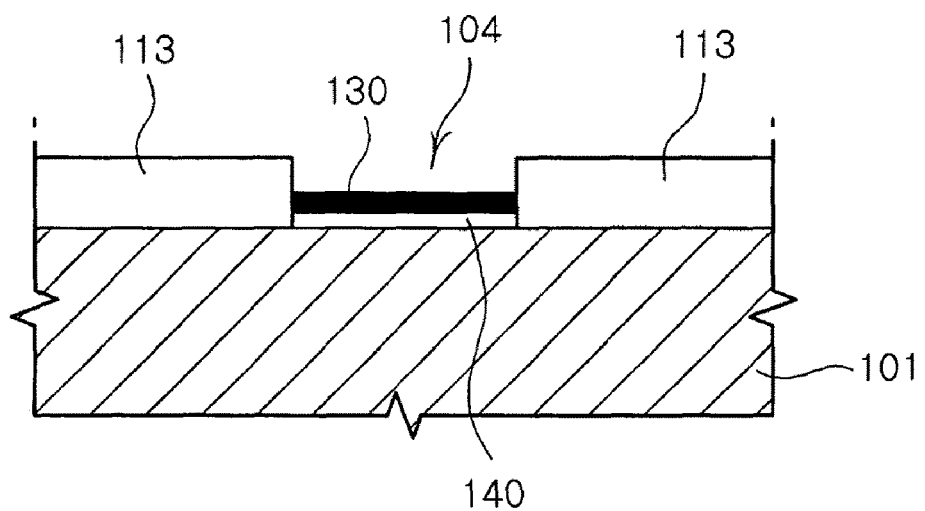
FIG. 6 is a partial cross-sectional view illustrating an anodized metal substrate module according to further another embodiment of the invention.

FIG. 6 is a partial cross-sectional view illustrating an anodized metal substrate according to an embodiment of the invention. As shown in FIG. 6, an insulating layer 140 and a metal layer 130 are sequentially stacked on each of the exposed portions 104 of the top surface of the metal plate 101. That is, the metal layer 130 is not directly formed on the metal plate 101 but the insulating layer 140 is interposed between the metal layer 130 and the metal plate 101. The insulating layer 140 may be made of $Al_2O_3$ which exhibits relatively good heat transfer properties. The insulating layer 140 insulates the metal layer 130 from the metal plate 101. This accordingly insulates bottom surfaces of the heat generating devices (not illustrated) mounted on the metal layer 130 from the metal plate 101. This configuration may be necessary when the heat generating devices cannot utilize the metal plate as a common electrode.

Figure 7:
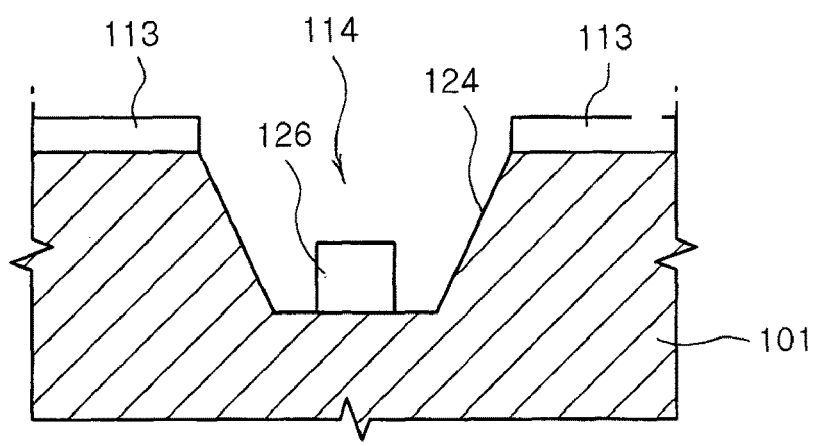
FIG. 7 is a partial cross-sectional view illustrating a portion of the anodized metal substrate according to further another embodiment of the invention.

FIG. 7 is a partial cross-sectional view illustrating an anodized metal substrate according to another embodiment of the invention. Referring to FIG. 7, an anodized film 113 is formed on a metal plate 101 to selectively expose portions of a top surface of the metal plate 101. Also, at least one recess 114 is formed in the exposed portions of the top surface of the metal plate 101 to define a reflective cup. A light emitting device such as an LED 126 may be mounted on a bottom surface of the reflective cup. The recess 114 can be formed by selective anodization and etching. That is, the exposed portions (104 of FIG. 4) of the top surface of the metal plate are anodized by using the selectively anodized film 113 as a mask. Then, an anodized resultant structure is etched to form the recess 114.

The anodized metal substrate module of FIG. 7 is applicable as a surface light source device or an LED-based backlight unit which is excellent in heat radiation properties and high light emitting efficiency. That is, the reflective cup is made of a highly reflective metal such as Al so that its inner surface can provide a reflecting surface 124 having high reflectivity. This reflective cup effectively reflects light from the LED in a desired exit direction, thereby further improving light emitting efficiency. Also, the substrate itself made of a metal material such as Al ensures excellent heat transfer properties.

Figure 8:
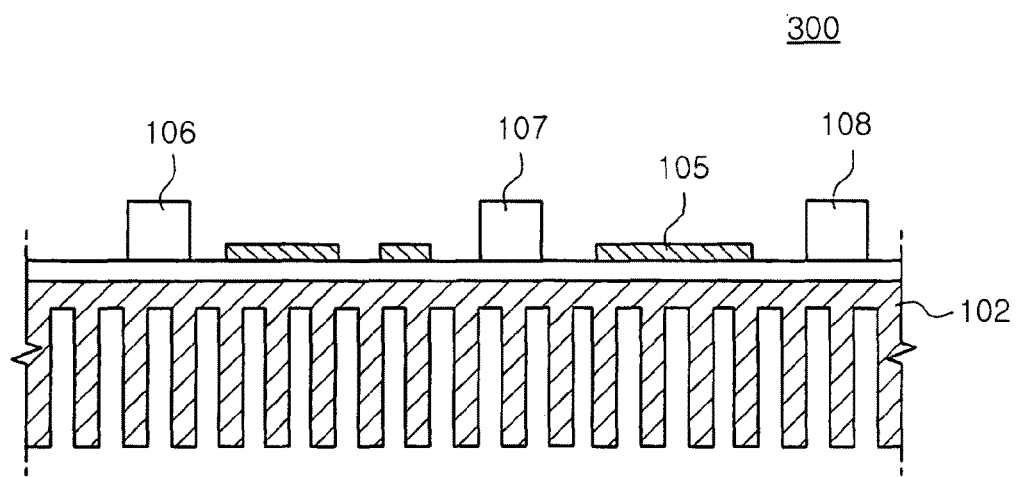
FIG. 8 is a schematic cross-sectional view illustrating an anodized metal substrate module according to further another embodiment of the invention.

FIG. 8 is a schematic view illustrating an anodized metal substrate module according to further another embodiment of the invention. Referring to FIG. 8, the anodized metal substrate module 300 includes a metal plate 102 as a lower structure, which is advantageous for radiating heat more efficiently. That is, a heat sink is integrally formed underneath the metal plate 102 to allow air contact in a larger area. This accordingly produces additional cooling effects. Specifically, cooling fins are perpendicularly extended from an underside surface of the metal plate 102.

As described above, the cooling fins are integrally formed underneath the metal plate 102. This eliminates a need for a conventional cumbersome process of bonding separate cooling fins onto an underside surface of the PCB or MCPCB. Also, the cooling fins (heat sink in a broader sense) formed integral precludes a reliability problem such as deterioration of a bonding material which may arise from bonding between the heat sink and the substrate.

EXAMPLE

Figure 2:
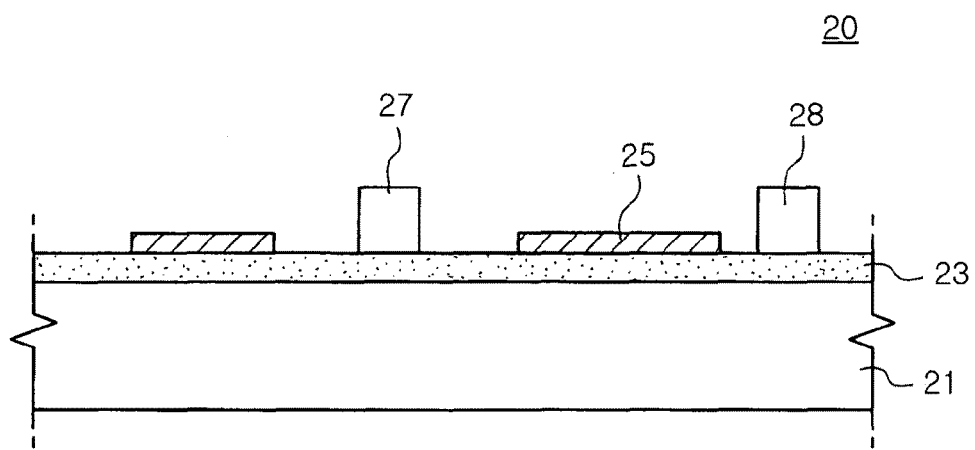
FIG. 2 is a schematic cross-sectional view illustrating a conventional metal core printed circuit board (MCPCB)

To compare and confirm heat transfer properties between a PCB or MCPCB and an anodized metal substrate module of the invention, the inventors conducted tests based on computer simulation. For these simulation tests, samples were set according to comparative example 1, comparative example 2, and inventive example. Comparative example 1 was a conventional resin (FR4)-based PCB configured as in FIG. 1. Comparative example 2 was an MCPCB using an Al core (refer to FIG. 2). The inventive example, as shown in FIG. 3, was an anodized substrate module with a stacked structure of an 'Al plate/an Al anodized film.' In comparative example 2, the MCPCB included a conventional polymer insulating layer having a heat conductive coefficient of about 1.3 W/mK. In contrast, the Al anodized film had a heat transfer coefficient of 10 W/mK to 30 W/mK.

Figure 9:
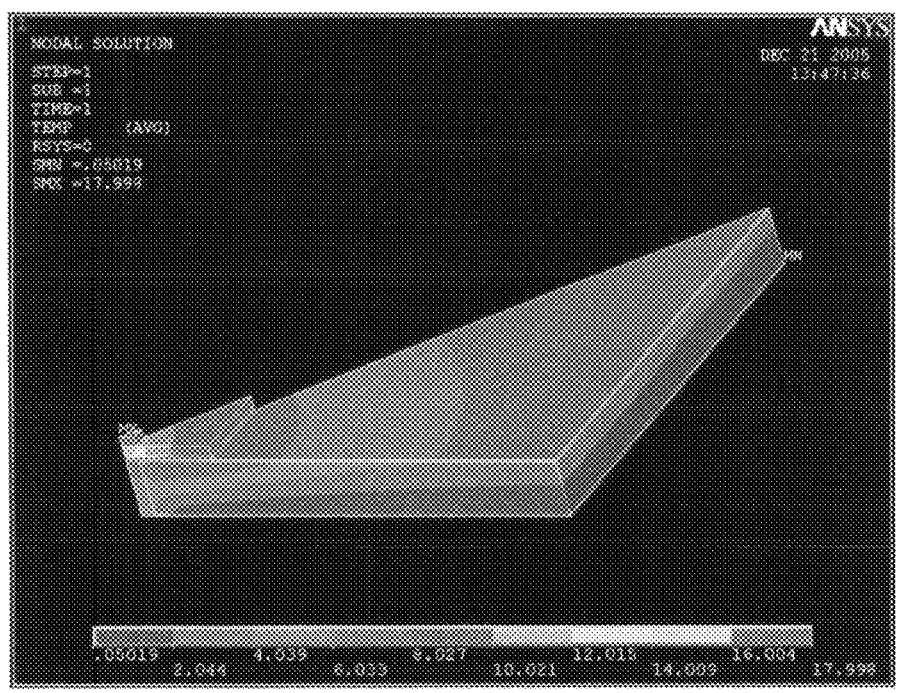
FIG. 9 is a view illustrating simulation results of heat resistance for comparative example 1.
Figure 10:
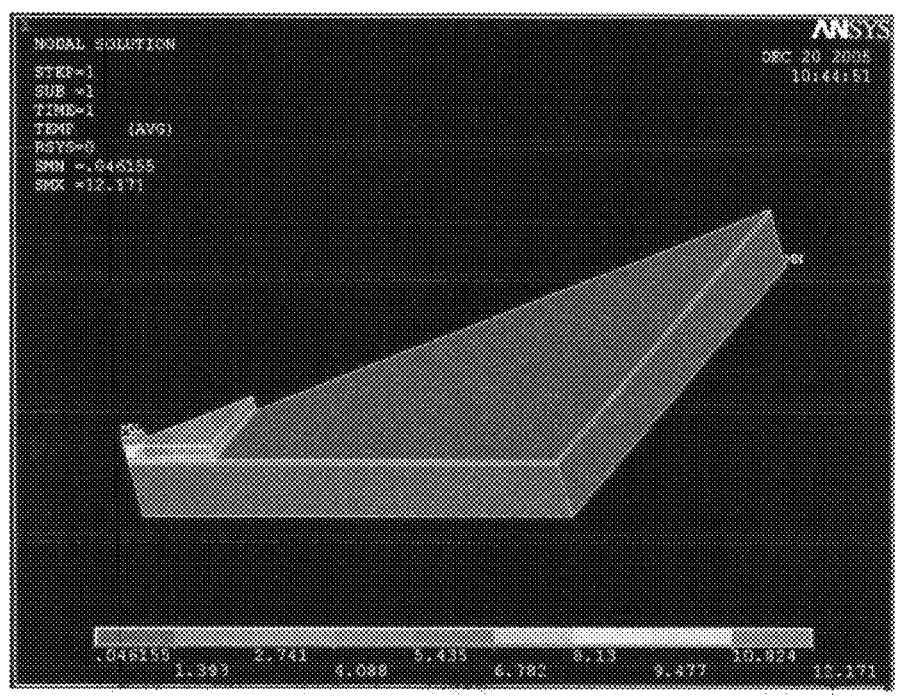
FIG. 10 is a view illustrating simulation results of heat resistance for comparative example 2.
Figure 11:
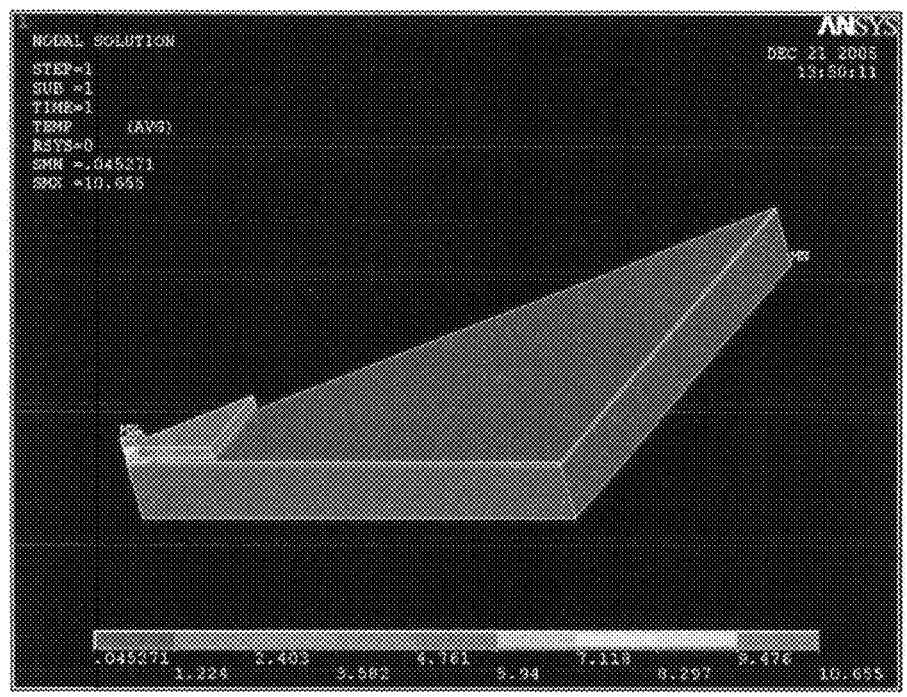
FIG. 11 illustrates simulation results of heat resistance for inventive example.

FIGS. 9 to 11 illustrate simulation results for heat resistance regarding the three samples (comparative example 1, comparative example 2 and inventive example). FIGS. 9 and 10 illustrate simulation results for heat resistance of comparative examples 1 and 2, respectively. FIG. 11 illustrates simulation results for heat resistance of the inventive example. Referring to FIGS. 9 to 11, a small portion in the uppermost layer indicates a heat generating device. The lowest layer corresponds to a base plate (Al plate in FIG. 11). A middle layer indicates a polymer (FIGS. 9 and 10) or an Al anodized oxide film (FIG. 11).

In FIGS. 9 to 11, the same color represents the same temperature. According to the simulation results, a heat resistance coefficient was plotted at 17.9 in comparative example 1 and at 12.171 in comparative example 2. Meanwhile, the heat resistance coefficient of the inventive example was plotted at merely 10.6. Here, the heat resistance coefficient denotes a temperature difference between the heat generating device D which is highest in temperature and the bottom surface of the substrate which is lowest in temperature. These simulation results for heat resistance confirm that the substrate module of the invention demonstrates much superior heat radiation properties to the prior art.

As set forth above, according to exemplary embodiments of the invention, a stacked structure of a metal plate/an anodized film is employed thereby to noticeably improve heat radiation properties, reduce manufacturing costs and simplify a manufacturing process. This anodized metal substrate module adopted allows easy configuration of a circuit board mounted with a surface light source, a backlight unit or other heat generating devices with superb heat radiation properties.

While the present invention has been shown and described in connection with the preferred embodiments, it will be apparent to those skilled in the art that modifications and variations can be made without departing from the spirit and scope of the invention as defined by the appended claims.

What is claimed is:

1. An anodized metal substrate module comprising:
   a metal plate;
   an anodized film selectively formed on the metal plate to selectively expose portions of the top surface of the metal plate;
   an insulating layer formed on at least one of the exposed portions of the top surface of the metal plate;

a plurality of heat generating devices mounted on the exposed portion; and a conductive line formed on the anodized film, wherein at least one of the heat generation devices is mounted on the insulating layer and at least one of the heat generating devices is mounted on the top surface of the metal plate and the heat generating devices mounted on the top surface of the metal plate utilize the metal plate as common electrode.

2. The anodized metal substrate module according to claim 1, wherein the metal plate comprises Al or an Al alloy.

3. The anodized metal substrate module according to claim 1, wherein the heat generating device comprises at least one light emitting diode.

4. The anodized metal substrate module according to claim 1, wherein the anodized metal substrate module is used for a surface light source device or a backlight unit.

5. The anodized metal substrate module according to claim 1, further comprising a metal layer formed on the exposed portion of the top surface of the metal plate.

6. The anodized metal substrate module according to claim 5, further comprising an insulating layer interposed between the metal layer and the metal plate.

7. The anodized metal substrate module according to claim 1, wherein the metal plate has at least one recess formed in the exposed portion of the top surface of the metal plate, the recess defining a reflective cup, and the light emitting diode is disposed on a bottom surface of the reflective cup.

8. The anodized metal substrate module according to claim 7, wherein the anodized metal substrate module is used for a surface light source device or a backlight unit.

9. The anodized metal substrate module according to claim 1, further comprising a heat sink integrally formed underneath the metal plate to allow air contact in a larger area.

10. The anodized metal substrate module according to claim 9, wherein the heat sink comprises cooling fins extending perpendicularly from an underside surface of the metal plate.

* * * * *